(12) United States Patent  (10) Patent No.: US 9,276,543 B2
Muthugounder Devarajan  (45) Date of Patent: Mar. 1, 2016

(54) ENHANCED AUDIO COMPONENT IN STREAMED MEDIA

(71) Applicant: Nook Digital, LLC, New York, NY (US)

(72) Inventor: Jagan Muthugounder Devarajan, Santa Clara, CA (US)

(73) Assignee: Nook Digital, LLC, New York, NY (US)

( * ) Notice: Subject to any disclaimer, the term of this patent is extended or adjusted under 35 U.S.C. 154(b) by 175 days.

(21) Appl. No.: 13/927,782

(22) Filed: Jun. 26, 2013

(65) Prior Publication Data

US 2013/0343574 A1  Dec. 26, 2013

Related U.S. Application Data

(60) Provisional application No. 61/690,396, filed on Jun. 26, 2012, provisional application No. 61/690,422, filed on Jun. 26, 2012.

(51) Int. Cl.
*H03G 3/00* (2006.01)
*H03G 3/20* (2006.01)
*H03G 3/30* (2006.01)

(52) U.S. Cl.
CPC ............... *H03G 3/20* (2013.01); *H03G 3/3005* (2013.01); *H03G 3/3089* (2013.01)

(58) Field of Classification Search
None
See application file for complete search history.

(56) References Cited

U.S. PATENT DOCUMENTS

| 6,996,445 B1 * | 2/2006 | Kamijo ............................ 700/94 |
| 2006/0259642 A1 * | 11/2006 | Du et al. ........................ 709/247 |
| 2009/0313544 A1 * | 12/2009 | Wood et al. .................... 715/716 |

* cited by examiner

*Primary Examiner* — Regina N Holder
(74) *Attorney, Agent, or Firm* — Finch & Maloney PLLC

(57) ABSTRACT

Techniques are provided for enhancing the audio component of streamed media provided by an application on a computing device, referred to collectively herein as an enhance audio mode. The mode may be configured to enhance audio by adjusting the volume gain during playback of streamed media from a specific application (e.g., Netflix or Pandora). In some cases, detection of playback from a specific media streaming application may be based on detection of a system file update, which may occur, for example, in a user space level. In some cases, the volume gain adjustment may be applied by an audio codec included with the computing device, which may occur, for example, in a kernel space level. The volume gain adjustment may be determined by analyzing the amplitude of the audio component of media streamed from a specific application relative to the speaker(s) included with the computing device.

18 Claims, 8 Drawing Sheets

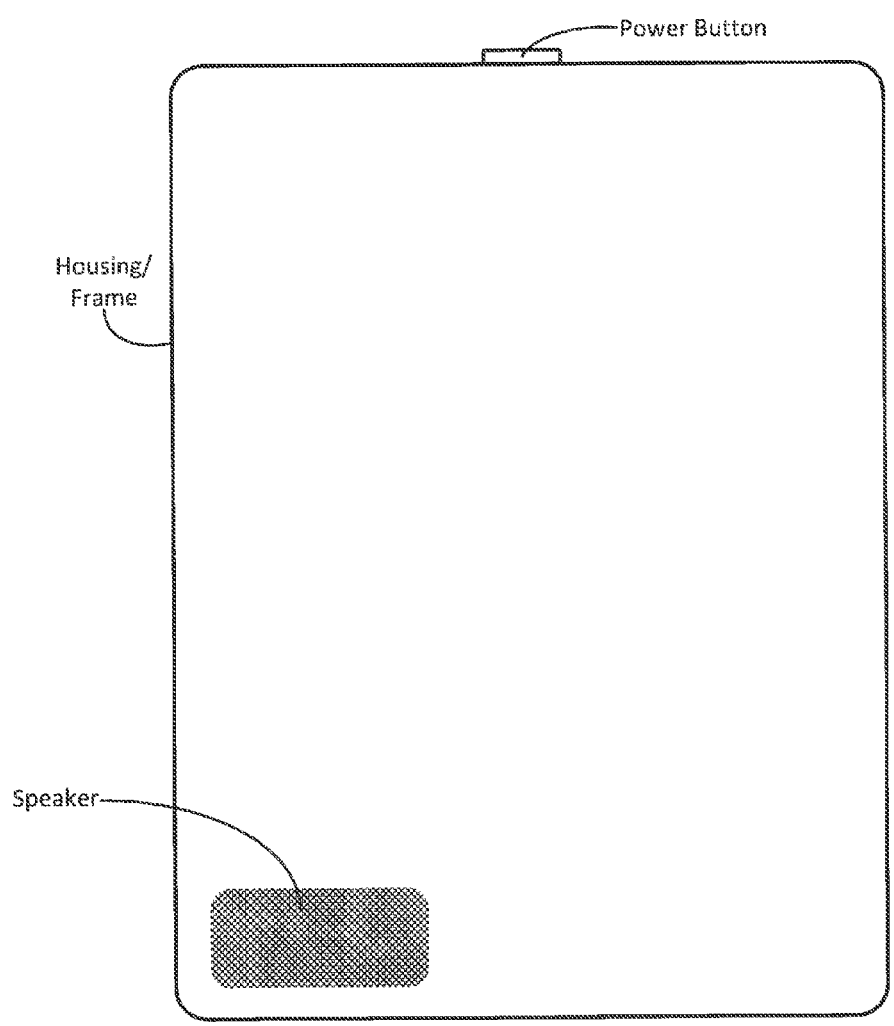

ENHANCED AUDIO COMPONENT IN STREAMED MEDIA

RELATED APPLICATION

This application claims the benefit of U.S. Provisional Application Nos. 61/690,396 and 61/690,422, both filed on Jun. 26, 2012. Each of these applications is herein incorporated by reference in its entirety.

FIELD OF THE DISCLOSURE

This disclosure relates to electronic computing devices, and more particularly, to enhanced audio for streaming media using an electronic computing device.

BACKGROUND

Electronic computing devices such as tablets, e-readers, mobile phones, smart phones and personal digital assistants (PDAs) are commonly used to provide a user with consumable content. The content may be, for example, an eBook, a web page, an online article or blog, images, a movie or video, or a map, just to name a few types. The computing devices may include one or more speakers to provide audio to a user. Such computing devices may also be useful for displaying a user interface that allows a user to interact with the device, its applications, and its content. The computing device may also include a touch sensitive surface/interface for receiving user input, such as a touch screen or a track pad. The user interface may include, for example, one or more touch screen controls and/or one or more displayed labels that correspond to nearby hardware buttons. A touch screen display may or may not be backlit, and may be implemented, for instance, with a light-emitting diode (LED) screen or an electrophoretic display.

BRIEF DESCRIPTION OF THE DRAWINGS

FIGS. 1a-c illustrate an example computing device having an enhance audio mode configured in accordance with an embodiment of the present invention.

DETAILED DESCRIPTION

Figure 1A:
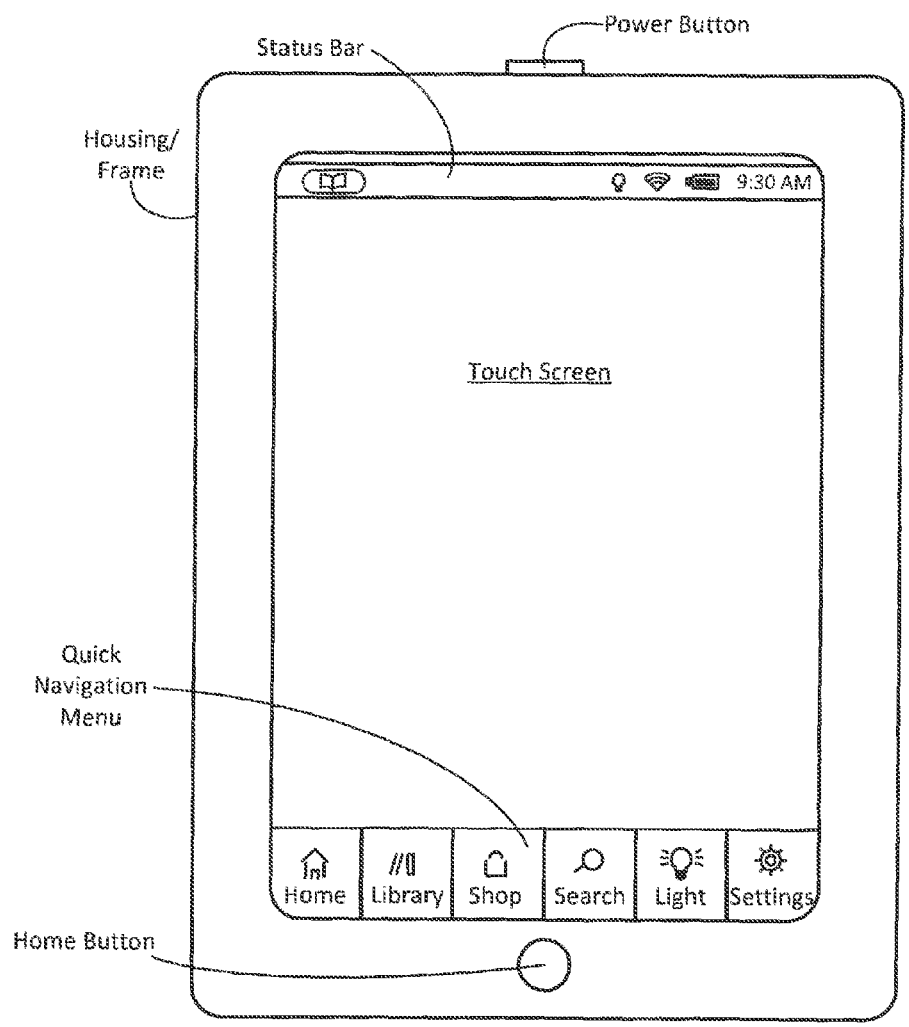

Techniques are provided for enhancing the audio component of streamed media provided by an application on a computing device, referred to collectively herein as an enhance audio mode. The mode may be configured to enhance audio by automatically adjusting the volume gain during playback of streamed media from a specific application (e.g., Netflix or Pandora), based on a previously learned audio gain adjustment factor for that application. Once an audio streaming application is known, its corresponding gain adjustment factor can be recalled and deployed. In some cases, detection of playback from a specific media streaming application may be based on detection of a system file update, which may occur, for example, in a user space level. In some cases, the volume gain adjustment may be applied by an audio codec included with the computing device, which may occur, for example, in a kernel space level. As is known, a typical computer operating system generally segregates virtual memory into user space and kernel space. The user space level refers to the memory area where user mode applications execute (such as an audio streaming application) and this memory can be swapped out when necessary. On the other hand, the kernel space level refers to memory reserved for running the kernel and kernel extensions, as well as most device drivers. In any such cases, the volume gain adjustment factor may be determined by analyzing the amplitude of the audio component of media streamed from a specific application relative to the speaker(s) included with the computing device. This analysis can be done in advance of a given streaming session, so as to effectively learn the typical audio gain performance of a given streaming application. Thus, a plurality of such applications can be analyzed to learn an appropriate adjustment factor for each application, and any subsequent use of those streaming applications can cause the recall and deployment of the corresponding factor to provide enhanced audio. Numerous other configurations and variations will be apparent in light of this disclosure.

General Overview

Presently, electronic computing devices support multiple applications, operating software, digital media, and various audio and video applications. For video and audio applications, a codec (coder-decoder or compressor-decompressor) is typically utilized for encoding or decoding a digital data stream or signal. The codec generally encodes a data stream or signal for transmission, storage, or encryption, or decodes it for playback or editing. Codecs may be used in videoconferencing, streaming media, and video editing applications, for example. For audio applications, an audio codec can be used to convert analog audio signals into digital signals for transmission or storage. Such audio codecs may be found in, for example, sound cards of computing devices. A receiving device can then convert the digital signals back to analog using an audio decompressor (e.g., for playback). Nonetheless, an audio output sometimes results in poor quality or undesirable volumes for a variety of reasons, such as, low amplitude, sampling rate, and/or insufficient output power of a speaker. For instance, with respect to one example problem, an audio component of streaming media (e.g., a video or audio stream) may be encoded with very low amplitude. Furthermore, the electronic device that executes the application used to playback the streaming media may be limited to one speaker and/or to a low maximum output power.

Thus, and in accordance with one or more embodiments of the present invention, techniques are provided for enhancing the audio component of streamed media provided by an application on a computing device, referred to collectively herein as an enhance audio mode. In some embodiments, the mode may be configured to enhance audio by automatically adjusting the volume gain during playback of streamed media from a specific application (e.g., Netflix, Hulu Plus, Pandora, Spotify, etc.). In such embodiments, the volume gain adjustment may be applied by an audio codec included with the computing device (e.g., an audio codec used in a sound card of the computing device) which may occur, for example, in a kernel space level, as will be discussed in turn. The enhance audio mode may be configured to adjust the volume gain on the audio codec based at least in part upon detection of playback from a specific media streaming application which may occur, for example, in a user space level. In some embodiments, detection of playback from a specific media streaming application may be based on detection of a system file update that occurs when the application is initiated and streaming media (sometimes referred to as a "sysfs" entry). Although the volume gain adjustment is described herein as occurring upon playback from a specific media streaming application, in some cases, the volume gain adjustment may be applied when the specific media streaming application is opened, active, or otherwise running, as will be apparent in light of this disclosure.

In some embodiments, the appropriate volume gain adjustment for a specific media streaming application, such as Netflix, may be based on the audio component of the streamed media provided from that application and/or the speaker(s) included with the computing device. In one such embodiment, the audio component of the streamed media provided by the application can be sampled to calculate the amplitude level encoded across various clips of the audio. After calculating the amplitude level for the audio component of media streamed from a specific media streaming application, the amplitude levels can be analyzed relative to the speaker(s) included with the computing device to calculate an appropriate volume gain adjustment for the specific application. The calculations and analysis may be performed using diagnostic tools, such as Audacity, Cool Edit Pro, or other suitable programs. In such an embodiment, if the audio component is encoded with low amplitude levels, the enhance audio mode may be configured to apply a volume gain increase to enhance audio quality by increasing the audibility or intelligibility of the audio, for example. However, if the audio component is encoded with high amplitude levels, the enhance audio mode may be configured to apply a volume gain decrease to enhance the audio quality by decreasing distortion at higher volumes or by providing a more appropriate volume range, for example.

As previously described, the appropriate volume gain adjustment applied using the enhance audio mode may be calculated by analyzing amplitude levels of the audio component of media streamed from a specific application relative to the speaker(s) included with the computing device. For example, this method was used to calculate a volume gain adjustment of +8 decibels for media streamed from the Netflix application using a Nook eReader having a mono speaker with a max power output at 0.74 watts. However, in some embodiments, the volume gain adjustment values may be supplied by the specific media streaming application provider (e.g., Netflix). In this manner, the media streaming provider can maintain, for example, a low amplitude level on the encoded audio component of its streamed media (e.g., to maintain low file size), while still allowing for the appropriate adjustment to be made to the audio component of the media at the device level. In such embodiments, the enhance audio mode may be configured to automatically apply the volume gain adjustments supplied by the application provider when the mode is enabled. In other embodiments, the volume gain adjustment values may be user-configurable. In such embodiments, the enhance audio mode may include a table of user-adjustable gain adjustment factors indexed by streaming application ID codes, so as to allow the user to set the desired volume gain adjustment per media streaming application, as will be discussed in turn.

In some embodiments, the computing device may include a headphone jack (or similar output socket) to allow the user to listen to audio from the computing device using headphones, a headset, or other suitable device. In some such embodiments, the enhance audio mode may be able to detect whether audio is being output to a speaker(s) or through the headphone jack. Therefore, the enhance audio mode may be configured to apply a volume gain adjustment for a specific media streaming application when listening to audio from streamed media through the headphone jack. In some instances, the volume gain adjustment may be the same whether the audio is being output to the speaker(s) or to the headphone jack. In other instances, the volume gain adjustment may be different. For example, in one case, the volume gain adjustment may be an increase of 8 decibels for the audio component of streamed video from the Netflix application when the audio is output through the speaker of the computing device. In such an example case, the volume gain adjustment may only be an increase of 4 decibels for the audio component of the same streamed video from the Netflix application when the audio is output through the headphone jack of the computing device.

In some embodiments, the enhance audio mode as variously described herein may be configured at a global level (e.g., based on the UI settings of the computing device) and/or at an application level (e.g., based on the specific media streaming application being used). For example, the enhance audio mode may be configured to be enabled for some applications and disabled for others. To this end, the enhance audio mode may be user-configurable, hard-coded, or some combination thereof (e.g., where some aspects are user-configurable and others are hard-coded), as will be apparent in light of this disclosure. Further, the enhance audio mode as variously described herein may be included initially with the UI (or operating system) of a computing device or be a separate program/service/application configured to interface with the UI of a computing device to incorporate the functionality of the enhance audio mode as variously described herein. In some embodiments, the enhance audio mode may come in the form of a computer program product (one or more non-transient computer readable mediums) that includes a plurality of instructions non-transiently encoded thereon to facilitate operation of an electronic device according to a process that includes the functionality of the enhance audio mode as variously described herein. Numerous variations and configurations will be apparent in light of this disclosure.

Computing Device and Configuration Examples

Figure 1B:
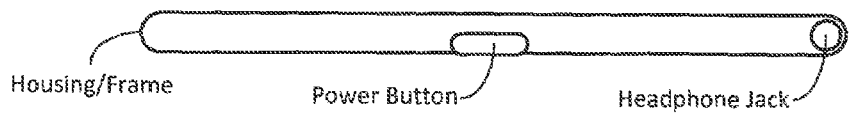

FIGS. 1a-c illustrate an example computing device having an enhance audio mode configured in accordance with an embodiment of the present invention. The device could be, for example, a tablet computer such as the NOOK® Tablet by Barnes & Noble. In a more general sense, the device may be any computing device capable of displaying digital content, such as a smart phone, eReader, tablet computer, laptop, or desktop computer, for example. In some instances, the computing device may be touch sensitive and include a touch screen display or a non-touch display screen that can be used in conjunction with a touch sensitive surface/interface, such as a track pad. As will be appreciated in light of this disclosure, the claimed invention is not intended to be limited to any particular kind or type of computing device. For ease of description, an example computing device is provided herein with touch screen technology.

As can be seen with the example embodiment shown in FIGS. 1a-c, the device comprises a housing/frame that includes a number of hardware features such as a power button and a press-button (sometimes called a home button herein). A touch screen based user interface (UI) is also provided (although a computing device running the enhance audio mode need not be touch sensitive), which in this example embodiment includes a quick navigation menu having six main categories to choose from (Home, Library, Shop, Search, Light, and Settings) and a status bar that includes a number of icons (a night-light icon, a wireless network icon, and a book icon), a battery indicator, and a clock. Other embodiments may have fewer or additional such UI touch screen controls and features, or different UI touch screen controls and features altogether, depending on the target application of the device. Any such general UI touch or non-touch controls and features can be implemented using any suitable conventional or custom technology, as will be appreciated. A headphone jack (e.g., a 3.5 mm stereo headphone jack) is also located at the top of the device (as shown in FIG. 1b). As can be seen in FIG. 1c, the device also includes a speaker located on the back of the device in the lower left corner. In this example embodiment, there is only one speaker (a mono speaker) having a max power output of 0.74 watts. Other embodiments may have a different speaker setup, which may affect the volume gain adjustment(s) used for the enhance audio mode, as will be apparent in light of this disclosure.

Although the computing device shown in FIGS. 1a-e uses a touch screen display, other touch sensitive embodiments may include a non-touch screen and a touch sensitive surface such as a track pad, or a touch sensitive housing configured with one or more acoustic sensors, etc. As previously described, the computing device need not be touch sensitive and may receive input from physical buttons, directional pads, joysticks, mouse pointing devices, and physical keyboards, just to name a few other examples. Continuing with the example computing device shown in FIGS. 1a-b, the power button can be used to turn the device on and off, and may be used in conjunction with a touch-based UI control feature that allows the user to confirm a given power transition action request (e.g., such as a slide bar or tap point graphic to turn power off). In this example device, the home button is a physical press-button that can be used to display the device's home screen when the device is awake and in use. Numerous other device configurations and variations will be apparent in light of this disclosure, and the claimed invention is not intended to be limited to any particular set of control features or device form factor.

Figure 1D:
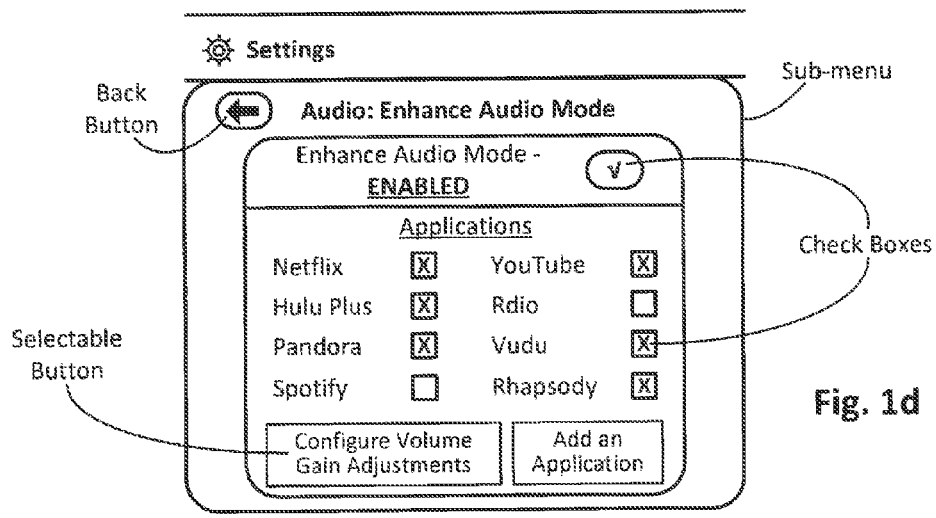
FIGS. 1d-e illustrate example configuration sub-menus for an enhance audio mode, configured in accordance with an embodiment of the present invention.

Continuing from FIG. 1a, the user can access an enhance audio mode configuration sub-menu, such as the one shown in FIG. 1d by tapping or otherwise selecting the Settings option in the quick navigation menu. After selection the Settings option, the user may be able to select any one of a number of options, including one designated Audio in this specific example case. Selecting this sub-menu item (with, for example, an appropriately placed screen tap) may cause the Enhance Audio Mode configuration sub-menu of FIG. 1d to be displayed, in accordance with an embodiment. In other example embodiments, the user may be able to access the sub-menu shown in FIG. 1d by navigating to the sub-menu in another suitable manner. In some instances, such a configuration sub-menu may be accessible through particular applications, such as a video or audio playback application. In other embodiments, the enhance audio mode may be hard-coded such that no configuration is needed or otherwise permitted. The degree of hard-coding versus user-configurability can vary from one embodiment to the next, and the claimed invention is not intended to be limited to any particular configuration scheme of any kind, as will be appreciated in light of this disclosure.

As will be appreciated, the various user interface (UI) control features and sub-menus displayed to the user are implemented as UI touch screen controls in this example embodiment. Such UI touch screen controls can be programmed or otherwise configured using any number of conventional or custom technologies. In general, the touch screen translates one or more touches (whether direct or proximate and whether made by a user's hand, a stylus, or some other suitable implement) in a particular location(s) into an electrical signal, which is then received and processed by the underlying operating system (OS), system software, and circuitry (processor, etc.) of the computing device. In some instances, note that the user need not actually physically touch the touch sensitive surface/interface to provide user input (e.g., when using a touch sensitive interface that recognizes hovering input). In embodiments where the computing device is not touch sensitive, input may be provided using a mouse, joystick, or directional pad, and one or more buttons, for example, to provide input similar to touching a touch screen. Additional example details of the underlying OS and circuitry in accordance with some embodiments will be discussed in turn with reference to FIG. 2a. As previously explained, in some cases, the enhance audio mode may be automatically configured by the specific UI or application being used. In these instances, the enhance audio mode need not be user-configurable (e.g., if the enhance audio mode is hard-coded or is otherwise automatically configured).

Continuing with FIG. 1d, in this example case, the Enhance Audio Mode configuration sub-menu includes a UI check box that when checked or otherwise selected by the user, effectively enables the mode (shown in the Enabled state); unchecking the box disables the mode. Other embodiments may have the enhance audio mode always enabled, or enabled by a switch or button, for example. In some instances, the enhance audio mode may be automatically enabled in response to an action, such as when playback from a specific media streaming application occurs, for example. As previously described, the user may be able to configure some or all of the features with respect to the enhance audio mode, so as to effectively give the user a say in, for example, what applications/streaming media can use the enhance audio mode and/or the associated volume gain adjustment, if so desired.

In the example case shown in FIG. 1d, once the enhance audio mode is enabled, the user can configure which applications are enabled to use this mode in the Applications section. Such a configuration feature may be helpful, for instance, in a tablet or laptop or other multifunction computing device that can execute different applications (as opposed to a computing device that is more or less dedicated to a particular application). As previously explained, in some embodiments, the enhance audio mode may be application specific or configured at an application level. As shown in this example case, the enhance audio mode is enabled for the following media streaming applications: Netflix, Hulu Plus, Pandora, YouTube, Vudu, and Rhapsody. For completeness of description, the enhance audio mode is disabled for the Spotify and Rdio media streaming applications. In some embodiments, such applications may need to be downloaded or otherwise provisioned onto the computing device before the applications can be configured. In this example embodiment, the configuration sub-menu shown in FIG. 1d also includes two selectable buttons that allow for additional configuration—Configure Volume Gain Adjustments and Add an Application. The Add an Application selectable button allows the user to add an application to be used with the enhance audio mode in this example embodiment.

Figure 1E:
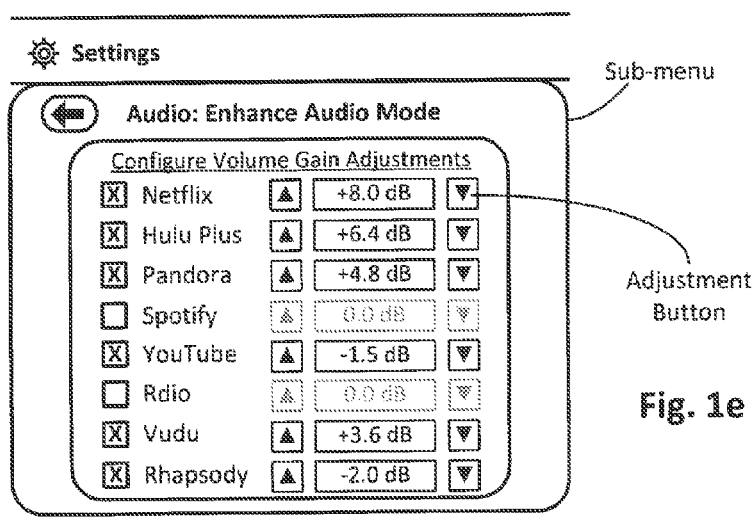

The Configure Volume Gain Adjustments selectable button may take the user to another configuration sub-menu, such as the example sub-menu shown in FIG. 1e. In this example sub-menu, the user can manually adjust the volume gain for each application using the table shown. As can be seen, the set volume gain adjustments are shown next to their corresponding applications and adjustment buttons are provided on either side of the adjustment numbers to allow for the increase (up arrow adjustment button) or decrease (down arrow adjustment button) of the volume gain for each media streaming application. For example, the enhance audio mode in this example configuration is set to increase the volume gain for Netflix by 8 decibels upon the detection of media playback from the Netflix application. Note that the applications having the enhance audio mode disabled (Spotify and Rdio in this example case) have no volume gain adjustment and are not adjustable in this example embodiment. In some embodiments, the enhance audio mode may be related or tied to one or more specific applications of the device's UI (or operating system), such that the enhance audio mode is only available, active, or running when such an application is available, active, or running. For example, the enhance audio mode may only be available, active, or running when a media streaming application (such as Netflix) is active and/or displayed, which may save memory and/or power of the computing device. Any number of applications or device functions may benefit from an enhance audio mode as provided herein, whether user-configurable or not, and the claimed invention is not intended to be limited to any particular application or set of applications.

Figure 2A:
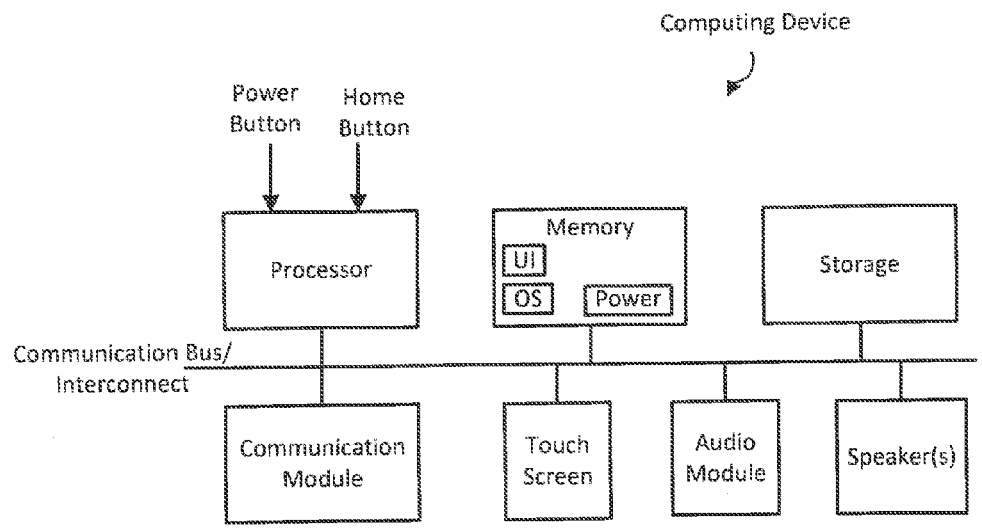
FIG. 2a illustrates a block diagram of a computing device configured in accordance with an embodiment of the present invention.

As can be further seen in FIG. 1d, a back button arrow UI control feature may be provisioned on the touch screen for any of the menus provided, so that the user can go back to the previous menu, if so desired. Note that configuration settings provided by the user can be saved automatically (e.g., user input is saved as selections are made or otherwise provided). Alternatively, a save button or other such UI feature can be provisioned, which the user can engage as desired. Again, while FIG. 1d shows one example of user-configurability, other embodiments may allow for a different configuration scheme or they may not allow for any such configuration, wherein the various features provided are hard-coded or otherwise provisioned by default. The degree of hard-coding versus user-configurability can vary from one embodiment to the next, and the claimed invention is not intended to be limited to any particular configuration scheme of any kind Architecture FIG. 2a illustrates a block diagram of a computing device configured in accordance with an embodiment of the present invention. As can be seen, this example device includes a processor, memory (e.g., RAM and/or ROM for processor workspace and storage), additional storage/memory (e.g., for content), a communications module, a touch screen, an audio module, and one or more speakers. A communications bus and interconnect is also provided to allow inter-device communication. Other typical componentry and functionality not reflected in the block diagram will be apparent (e.g., battery, co-processor, etc.). Further note that although a touch screen display is provided, other touch sensitive embodiments may include a non-touch screen and a touch sensitive surface such as a track pad, or a touch sensitive housing configured with one or more acoustic sensors, etc. In this manner, a non-touch sensitive computing device can become a touch sensitive computing device by adding an interfacing touch sensitive component. However, as previously explained, some embodiments may be non-touch sensitive. The principles provided herein equally apply to any such computing device. For ease of description, examples are provided with touch screen technology.

The display can be implemented, for example, with a 7 to 9 inch 1920×1280 IPS LCD touchscreen touch screen, or any other suitable display and touch sensitive interface technology. The touch sensitive surface (touch sensitive display or touch screen, in this example) can be any device that is configured with user input detecting technologies, whether capacitive, resistive, acoustic, active or passive stylus, and/or other input detecting technology. The screen display can be layered above input sensors, such as a capacitive sensor grid for touch-based input (e.g., with a finger or passive stylus in the case of a so-called in-plane switching (IPS) panel), or an electro-magnetic resonance (EMR) sensor grid (e.g., for sensing a resonant circuit of the stylus). In some embodiments, the touch screen display can be configured with a purely capacitive sensor, while in other embodiments the touch screen display may be configured to provide a hybrid mode that allows for both capacitive input and active stylus input. In any such embodiments, a touch screen controller may be configured to selectively scan the touch screen display and/or selectively report contacts detected directly on or otherwise sufficiently proximate to (e.g., within a few centimeters) the touch screen display. The proximate contact may include, for example, hovering input used to cause location specific input as though direct contact were being provided on a touch sensitive surface (such as a touch screen). Numerous touch screen display configurations can be implemented using any number of known or proprietary screen based input detecting technology.

Continuing with the example embodiment shown in FIG. 2a, the memory includes a number of modules stored therein that can be accessed and executed by the processor (and/or a co-processor). The modules include an operating system (OS), a user interface (UI), and a power conservation routine (Power). The modules can be implemented, for example, in any suitable programming language (e.g., C, C++, objective C, JavaScript, custom or proprietary instruction sets, etc.), and encoded on a machine readable medium, that when executed by the processor (and/or co-processors), carries out the functionality of the device, including an enhance audio mode as variously described herein. The computer readable medium may be, for example, a hard drive, compact disk, memory stick, server, or any suitable non-transitory computer/computing device memory that includes executable instructions, or a plurality or combination of such memories. Other embodiments can be implemented, for instance, with gate-level logic or an application-specific integrated circuit (ASIC) or chip set or other such purpose built logic, or a microcontroller having input/output capability (e.g., inputs for receiving user inputs and outputs for directing other components) and a number of embedded routines for carrying out the device functionality. In short, the functional modules can be implemented in hardware, software, firmware, or a combination thereof.

The processor can be any suitable processor (e.g., Texas Instruments OMAP4, dual-core ARM Cortex-A9, 1.5 GHz), and may include one or more co-processors or controllers to assist in device control. In this example case, the processor cam receive input from the user, including input from or otherwise derived from the power button, home button, and touch sensitive surface. In other embodiments, the processor may be configured to receive input from other input devices, such as from a mouse or keyboard, for example. The processor can also have a direct connection to a battery so that it can perform base level tasks even during sleep or low power modes. The memory (e.g., for processor workspace and executable file storage) can be any suitable type of memory and size (e.g., 256 or 512 Mbytes SDRAM), and in other embodiments may be implemented with non-volatile memory or a combination of non-volatile and volatile memory technologies. In some embodiments, the operating system may segregate the memory into a kernel space and a user space. In such embodiments, the kernel space may be reserved for running the kernel, kernel extensions, and device drivers, while the user space may be the memory are where all user mode applications work. As will be apparent in light of this disclosure, some of the enhanced audio mode functionality as variously described herein may be performed at the kernel level, while some of the functionality may be performed at the user space level, as will be discussed in turn. The storage (e.g., for storing consumable content and user files) can also be implemented with any suitable memory and size (e.g., 2 GBytes of flash memory).

The communications module can be configured to execute, for instance, any suitable protocol or interface which allows for connection to a local network so that content can be downloaded to the device from a remote location (e.g., content provider, etc., depending on the application of the computing device). The communication module may be used to help establish a connection via Ethernet, Wi-Fi, infrared, cellular technology (3G/4G), or any other suitable connection capable of transmitting streamed media to the computing device, for example. In some embodiments, the communication module may include 802.11b/g/n WLAN (Wi-Fi), a cellular radio chip (3G/4G), and/or other suitable chip or chip set (including any custom or proprietary protocols). The connection established using the communication module may be used by one or more applications to receive streams of media having an audio component. The audio component of the media stream may be encoded with Advanced Audio Coding (AAC), in an example embodiment, to produce a digital data format. AAC is a standardized, lossy compression and encoding scheme for digital audio. Alternatively, in another embodiment, the audio component of the media stream may be encoded with an MP3 or other suitable coding scheme.

In some specific example embodiments, the device housing or frame that contains all the various componentry measures about 7" to 9" high by about 5" to 6" wide by about 0.5" thick, and weighs about 7 to 8 ounces. Any number of suitable form factors can be used, depending on the target application (e.g., laptop, smart phone, etc.). The device may, for example, smaller for smart phone and eReader applications and larger for tablet computer applications. In a specific example embodiment, the device includes a mono speaker that has a max power output of 0.74 watts. However, any number of speakers having any suitable specifications may included in or with the computing device. For example, the computing device may include stereo speakers of varying wattage. In some embodiments, the computing device may include a headphone or audio jack (e.g., a 3.5 mm stereo headphone jack) to allow a user to output the audio to a headphone, headset, or other suitable device. As previously explained the specifications of the speaker(s) and/or the headphone jack may be used to calculate enhance audio mode volume gain adjustments for one or more applications.

The operating system (OS) module can be implemented with any suitable OS, but in some example embodiments is implemented with Google Android OS or Linux OS or Microsoft OS or Apple OS. The power management (Power) module can be configured as typically done, such as to automatically transition the device to a low power consumption or sleep mode after a period of non-use. A wake-up from that sleep mode can be achieved, for example, by a physical button press and/or a touch screen swipe or other action. The audio module can be configured, for example, to speak or otherwise aurally present a selected eBook or other textual content. In some example cases, if additional space is desired, for example, to store digital books or other content and media, storage can be expanded via a microSD card or other suitable memory expansion technology (e.g., 32 GBytes, or higher). The UI module can be, for example, based on touch screen technology, and the various example screen shots and example use-cases shown in FIGS. 1a and 1d, in conjunction with the enhance audio mode examples and methodologies demonstrated in FIGS. 3-7, which will be discussed in turn.

Client-Server System

Figure 2B:
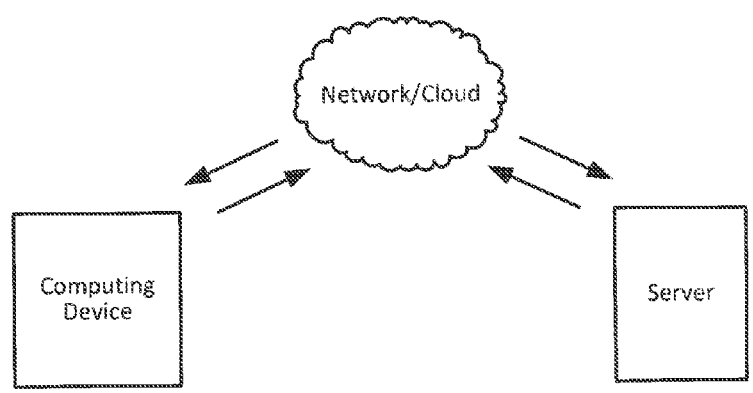
FIG. 2b illustrates a block diagram of a communication system including the computing device of FIG. 2a, configured in accordance with an embodiment of the present invention.

FIG. 2b illustrates a block diagram of a communication system including the computing device of FIG. 2a configured in accordance with an embodiment of the present invention. As can be seen, the system generally includes a computing device that is capable of communicating with a server via a network/cloud. In this example embodiment, the computing device may be, for example, an eReader, a smart phone, a laptop, a tablet computer, a desktop computer, or any other suitable computing device. The network/cloud may be a public and/or private network, such as a private local area network operatively coupled to a wide area network such as the Internet. In this example embodiment, the server may be programmed or otherwise configured to receive content requests from a user via the computing device and to respond to those requests by providing the user with requested or otherwise recommended content. In some such embodiments, the server may be configured to remotely provision an enhance audio mode as provided herein to the computing device (e.g., via JavaScript or other browser based technology) and/or to provide streaming media. In other embodiments, portions of the methodology may be executed on the server and other portions of the methodology may be executed on the device. Numerous server-side/client-side execution schemes can be implemented to facilitate an enhanced audio mode in accordance with one or more embodiments, as will be apparent in light of this disclosure.

Enhance Audio Mode Examples

Figure 3:
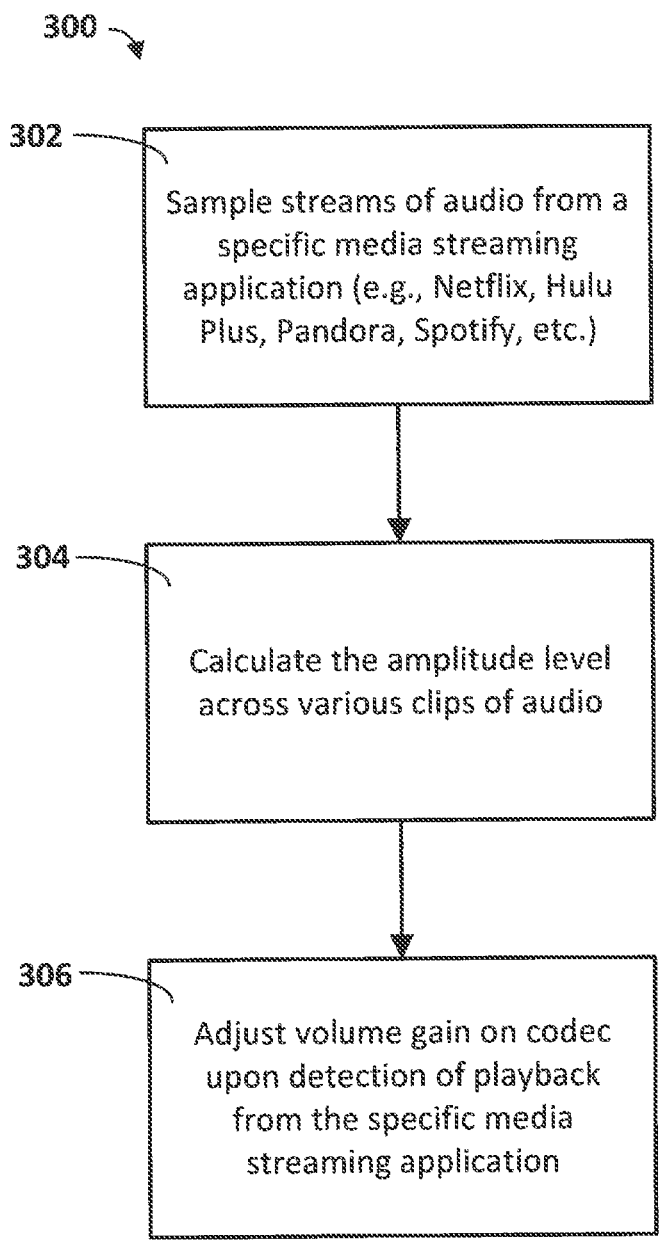
FIG. 3 illustrates an example enhance audio mode method, in accordance with an embodiment of the present invention.

The enhance audio mode techniques described in FIGS. 3-6 may be performed using a computing device as variously described herein. FIG. 3 illustrates an example enhance audio mode method, in accordance with an embodiment of the present invention. Initially, the method 300 depicts sampling streams of audio from a specific media streaming application (e.g., Netflix, Hulu Plus, Pandora, Spotify, etc.), depicted at 302, that precedes calculating amplitude level across various clips of the audio, depicted at 304. In one example embodiment, after the sampling and modulation is performed, as described herein, the samples are collected and transferred to a computing device for analysis. In one embodiment, the waveforms are analyzed using diagnostic tools, such as Audacity, Cooledit Pro, or other suitable programs to determine amplitude. After the amplitude level across various clips of the audio component of the streamed media have been determined, the amplitude levels may be analyzed relative to the specifications of the speaker(s) included with the computing device (e.g., maximum power output) to determine appropriate volume gain adjustment levels, as previously explained. As previously explained, the volume gain adjustment assigned to a specific application may be user-configurable or included with the application itself.

Based on the previous sampling and calculating analysis, the method depicts adjusting a volume gain on the audio codec based, at least in part, on detection of playback from the specific media streaming application, depicted at 306. In one embodiment, the audio stream is from a Netflix streaming application. In such an embodiment, the volume gain is adjusted based on detection of the playback of the Netflix application as detected by a system file update. For example, as the Netflix application is initiated and streaming/providing playback, a library at a user space level can update an entry in a system file (sometimes referred to as a "sysfs" entry). The entry in the system file can then be used by the enhance audio mode to detect that media playback is being performed by the application and to apply the appropriate volume gain adjustment for that specific application (e.g., Netflix). In one example embodiment, when using the enhance audio mode on a computing device having a mono speaker with a max power output at 0.74 watts, the volume gain adjustment applied is +8 dB (a volume gain increase of 8 decibels).

Figure 4:
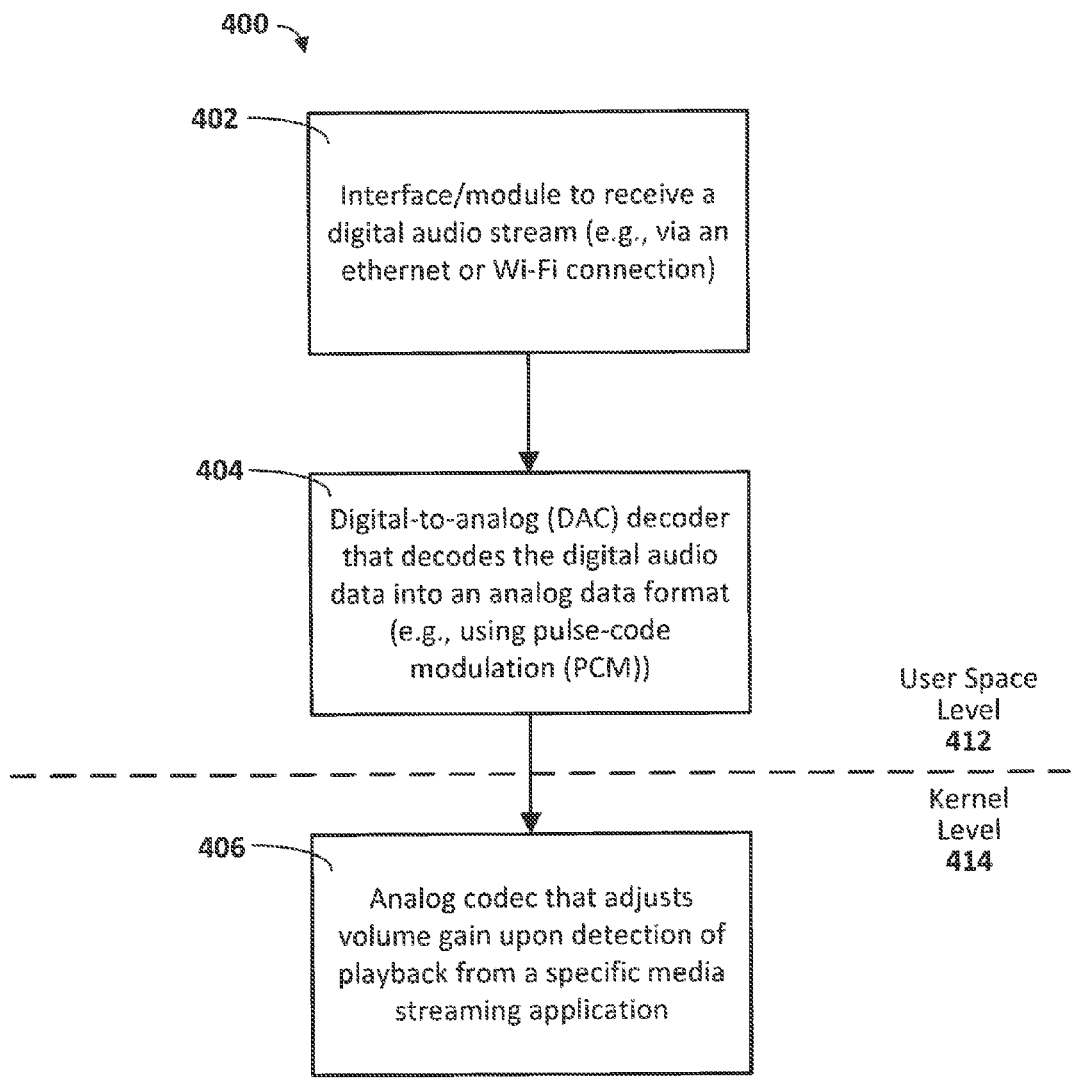
FIG. 4 illustrates an electronic device including the functionality of an example enhance audio mode, in accordance with an embodiment of the present invention.

FIG. 4 illustrates an electronic device including the functionality of an example enhance audio mode, in accordance with an embodiment of the present invention. In this embodiment 400, the various codecs and hardware interfaces/modules are depicted. An interface/module to receive a digital audio stream (the audio component of the streamed media) is depicted at 402. In one embodiment, the interface/module may be the communication module as previously described with reference to FIG. 2a. In such an embodiment, the communication module may establish a connection for receiving the streamed media (e.g., via an Ethernet or Wi-Fi connection). The audio stream may be encoded with Advanced Audio Coding (AAC) to produce a digital data format. AAC is a standardized, lossy compression and encoding scheme for digital audio. Alternatively, in another embodiment, the audio stream may be encoded with an MP3 or other suitable coding scheme.

Continuing with the device shown in FIG. 4, the encoded digital audio stream is input to a digital-to-analog (DAC) decoder block 404 that decodes the digital audio data format into an analog data format. The decoding or conversion may be performed by a pulse-code modulation (PCM) or other suitable method. The resulting output analog data from the decoder 404 is sent to block 406, which is an analog codec. The analog codec adjusts volume gain upon detection of playback from a specific media streaming application or upon detection of a predetermined event or mode setting. In one example embodiment, continuing with the Netflix application, the mode of the Netflix audio parameters are as follows: the digital audio stream is encoded with AAC as previously described, audio mode of a 16-bit PCM, and a sampling rate of 44.1 to 48 kHz. However, the claimed subject matter is not intended to be limited to the previous sampling parameters and such parameters are provided for illustrative purposes for a specific streamed media and speaker combination.

Figure 5:
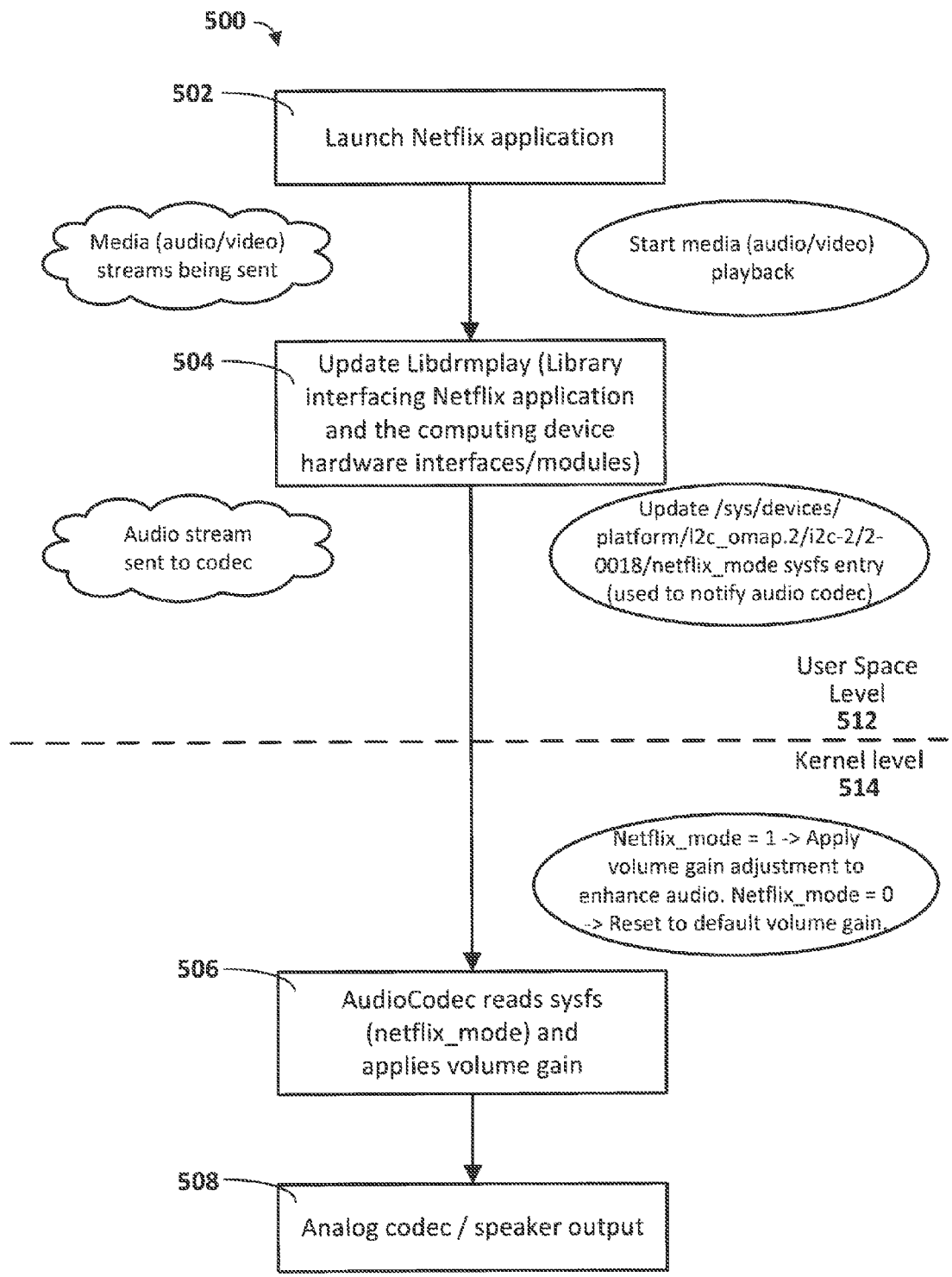
FIG. 5 illustrates an example enhance audio mode method, in accordance with another embodiment of the present invention.

FIG. 5 illustrates an example enhance audio mode method, in accordance with another embodiment of the present invention. FIG. 5 depicts a library perspective and flowchart 500 for execution of applications and library updates. In this example embodiment, the methods and flowchart may be incorporated into instructions (e.g., a computer program product) that reside on a computer readable medium. Upon execution of the instructions by a computing device, the enhance audio mode may be used to enhance audio for media streamed from a specific media streaming application by adjusting the volume gain (e.g., using an audio codec) for the audio component of the media.

Initially, a media streaming application, such as Netflix is launched, as depicted in block 502, which can be used to initiate video playback (using audio/video streams being sent to the computing device). Netflix is being used as the specific application in this example embodiment; however, the claimed invention is not intended to be limited to any particular or specific application, unless otherwise stated. A library, Libdrmplay in this example case (which is a library interfacing the Netflix application and the computing device hardware interfaces/modules), is updated to reflect the Netflix application mode, as depicted by block 504. The library is updated via a sysfs (system file) entry to notify the audio codec (shown as update /sys/devices/platform/12c_omap.2/i2c-2/2-0018/netflix_mode sysfs entry), and the audio stream is then sent to an audio codec. In one embodiment, blocks 502 and 504 are performed in a user space level 512 (e.g., an Android user space level). Upon receiving the audio stream, the audio codec reads the sysfs entry to determine if the Netflix operation is active. If so, the appropriate volume gain adjustment is applied to the audio stream, as depicted by block 506. Otherwise, a reset to default volume gain is performed. This decision block is depicted in the oval to the right of block 506.

Consequently, the analog codec receives the output of the applied volume gain from block 506, which is forwarded to a speaker output, as depicted by block 508. In this embodiment, blocks 506 and 508 are performed in a kernel level 514. In another embodiment, block 506 may be performed in a kernel level 514 and the block 508 may be performed in a hardware level of a microprocessor, micro-controller, or field-programmable gate array (FPGA), as depicted in connection with FIG. 6. In some embodiments, the audio (including the applied volume gain) may be forwarded to a headphone jack output, as previously described. In such embodiments, the volume gain applied may be dependent on whether the audio is output to one or more speakers, or to a headphone jack.

Figure 6:
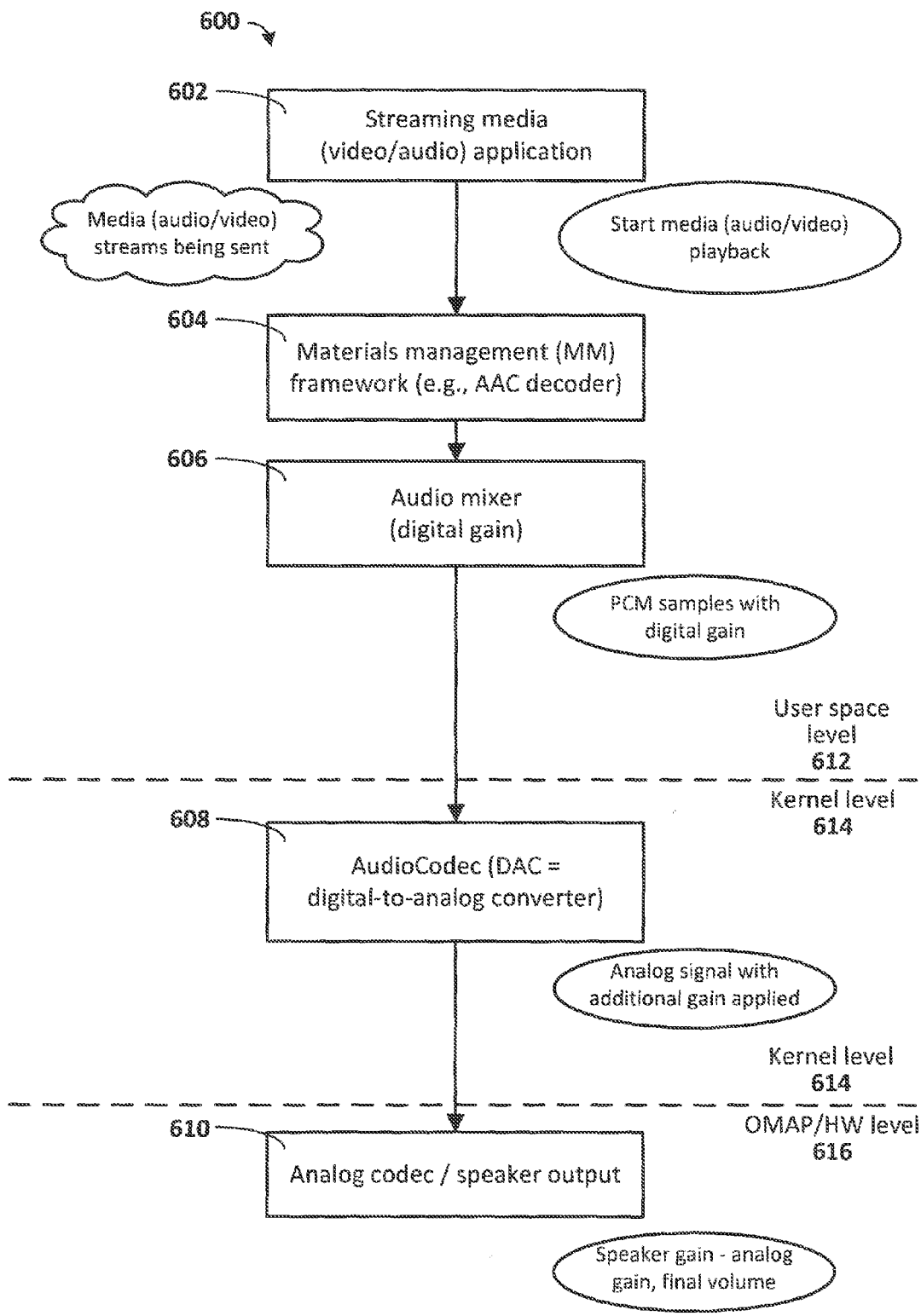
FIG. 6 illustrates an example enhance audio mode method, in accordance with another embodiment of the present invention.

FIG. 6 illustrates an example enhance audio mode method, in accordance with another embodiment of the present invention. As shown, the method 600 starts out at with a streaming media application (capable of streaming audio and/or video), as depicted at block 602, which can be used to initiate video playback (using audio/video streams being sent to the computing device). The media is sent through a materials management (MM) framework (e.g., an AAC decoder), depicted at block 604. Afterwards, in this example embodiment, the media is sent to an audio mixer (e.g., an Android audio mixer), depicted in block 606, where a unity digital volume gain is applied to all audio streams. Note that the applied unity gain does not increase the gain above the default codec gain and that the preceding blocks existed in a user space level 612, in this example embodiment. The resulting PCM samples with the digital gain are then sent to an audio codec (AudioCodec), depicted at block 608, which performs a digital-to-analog (DAC) gain that is an additional gain on top of the encoded audio gain. This codec applies the digital gain and converts the digital signals to audio signals, which is performed at a kernel level 614. Then, an analog codec and speaker output, depicted at block 610, allows for a gain on the analog signal (received from the previous block 608) is performed at an Open Multimedia Applications Platform (OMAP)/hardware (HW) level 616.

Numerous variations and embodiments will be apparent in light of this disclosure. One example embodiment of the present invention provides a computing device including a processor, and an enhance audio mode executable on the processor. The enhance audio mode is configured to apply a volume gain adjustment to an audio component of media streamed from a specific application, in response to playback of streaming media by the application. In some cases, the volume gain adjustment is applied by an audio codec. In some such cases, the audio codec is a digital-to-analog (DAC) audio codec. In some cases, the volume gain adjustment is applied upon detection of playback by the specific application in a kernel space level. In some cases, the volume gain adjustment for the specific application is calculated by analyzing the amplitude of an audio component of media sampled from the specific application. In some such cases, the device includes one or more speakers, wherein the volume gain adjustment is further calculated based on the specifications of the one or more speakers. In some cases, the enhance audio mode is configured to detect playback of the streaming media from the specific application based on a system file update. In some such cases, the system file update occurs at a user space level. In some cases, the volume gain adjustment increases the volume gain for all audio played using the specific application. In some cases, the enhance audio mode is configured to operate with a plurality of specific applications, and each application has a different corresponding volume gain adjustment. In some such cases, the volume gain adjustment for a specific application is retrieved from a table upon playback from the specific application. In some cases, the enhance audio mode is configured to apply a first volume gain adjustment if the audio component of the media is being output to one or more speakers of the computing device, and a second volume gain adjustment if the audio component of the media is being output to a headphone jack of the computing device. In some cases, the enhance audio mode is user-configurable.

Another example embodiment of the present invention provides a computer program product including a plurality of instructions non-transiently encoded thereon to facilitate operation of an electronic device according to a process. The computer program product may include one or more computer readable mediums such as, for example, a hard drive, compact disk, memory stick, server, cache memory, register memory, random access memory, read only memory, flash memory, or any suitable non-transitory memory that is encoded with instructions that can be executed by one or more processors, or a plurality or combination of such memories. In this example embodiment, the process is configured to invoke an enhance audio mode configured to apply a volume gain adjustment to an audio component of streaming media from a specific application (in response to playback of the streaming media by the application), and apply the volume gain adjustment. In some cases, the volume gain adjustment is applied by an audio codec. In some cases, the volume gain adjustment is a single adjustment in the range of −10 decibels to +10 decibels. In some cases, the process is further configured to apply a default volume gain in response to a stoppage in the playback of the streaming media by the specific application. In some cases, the enhance audio mode is configured to operate with a plurality of specific applications, and each application has a different corresponding volume gain adjustment.

Another example embodiment of the present invention provides a computer program product including a plurality of instructions non-transiently encoded thereon to facilitate operation of an electronic device according to a process. As previously described, the computer program product may include one or more computer readable mediums such as, for example, a hard drive, compact disk, memory stick, server, cache memory, register memory, random access memory, read only memory, flash memory, or any suitable non-transitory memory that is encoded with instructions that can be executed by one or more processors, or a plurality or combination of such memories. In this example embodiment, the process is configured to update an entry in a system file in a user space level of the electronic device upon detection of a streaming media application, perform a volume gain adjustment to the audio component of the streaming media upon detection of the application in a kernel space level of the electronic device, and forward the audio component to an audio output. In some cases, the audio output is one of one or more speakers and a headphone jack.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A computing device, comprising:
 a processor; and
 an enhance audio mode executable on the processor, the processor configured to:
 cause to be received, into a memory, a sample of an audio component of one or more digital media streams from a specific media streaming application;
 cause conversion, with a digital-to-analog converter, of the one or more digital media streams into corresponding one or more analog media streams;
 analyze an amplitude of the audio component of the one or more analog media streams from the specific media streaming application; and
 cause a volume gain adjustment to be applied to the audio component of the one or more analog media streams from the specific media streaming application, the volume gain adjustment based on the analyzed amplitude of the audio component.

2. The device of claim 1 wherein the volume gain adjustment is applied by an audio codec.

3. The device of claim 1 wherein the volume gain adjustment is applied upon detection of playback of the one or more analog media streams by the specific media streaming application in a kernel space level.

4. The device of claim 1 further comprising one or more speakers, wherein the volume gain adjustment is further calculated based on the specifications of the one or more speakers.

5. The device of claim 1 wherein the enhance audio mode is further configured to detect playback of the one or more media streams from the specific media streaming application based on a system file update.

6. The device of claim 5 wherein the system file update occurs at a user space level.

7. The device of claim 1 wherein the volume gain adjustment increases the volume gain for all audio components of the one or more analog media streams played using the specific media streaming application.

8. The device of claim 1 wherein the enhance audio mode is further configured to operate with a plurality of specific media streaming applications, and each specific media streaming application of the plurality has a different corresponding volume gain adjustment.

9. The device of claim 8 wherein the volume gain adjustment for a specific media streaming application of the plurality of specific media streaming applications is retrieved from a table upon playback from the specific application.

10. The device of claim 1 wherein the enhance audio mode is further configured to apply a first volume gain adjustment if the audio component of the one or more analog media streams is being output to one or more speakers of the computing device, and a second volume gain adjustment if the audio component of the one or more media streams is being output to a headphone jack of the computing device.

11. The device of claim 1 wherein the enhance audio mode is user-configurable.

12. A non-transitory computer program product stored on a non-transitory computer-readable medium that includes a plurality of instructions that, when loaded into memory, cause a processor to perform a method, the method comprising:
    in response to playback of one or more digital media streams from a specific media streaming application, invoke an enhance audio mode configured to:
        sample an audio component of the one or more digital media streams from the specific media streaming application;
        cause conversion, using a digital-to-analog converter, of the one or more digital media streams into corresponding one or more analog media streams;
        analyze an amplitude of the audio component of the one or more analog media streams from the specific media streaming application;
        apply a volume gain adjustment to the audio component of the one or more analog media streams from the specific media streaming application, the volume gain adjustment applied based on the analyzed amplitude of the audio component.

13. The non-transitory computer program product of claim 12 wherein the volume gain adjustment is applied by an audio codec.

14. The non-transitory computer program product of claim 12 wherein the volume gain adjustment is a single adjustment in the range of −10 decibels to +10 decibels.

15. The non-transitory computer program product of claim 12 wherein the process is further configured to apply a default volume gain in response to a stoppage in the playback of the one or more analog media streams from the specific media streaming application.

16. The non-transitory computer program product of claim 12 wherein the enhance audio mode is further configured to operate with a plurality of specific media streaming applications, and each specific media streaming application of the plurality has a different corresponding volume gain adjustment.

17. A non-transitory computer program product stored on a non-transitory computer-readable medium that includes a plurality of instructions that, when loaded into memory, cause a processor to perform a method, the method comprising:
    sample an audio component of one or more media streams from a specific media streaming application;
    analyze an amplitude of the audio component of the one or more media streams from the specific media streaming application;
    update an entry in a system file in a user space level of the electronic device upon detection of the one or more media streams from the specific media streaming application;
    perform a volume gain adjustment to the audio component of the one or more media streams from the specific media streaming application upon detection of the of the specific media streaming application in a kernel space level of the electronic device, the volume gain adjustment based on the analyzed amplitude of the audio component; and
    forward the audio component of the one or more media streams to an audio output.

18. The non-transitory computer program product of claim 17 wherein the audio output is one of one or more speakers and a headphone jack.

\* \* \* \* \*